(12) United States Patent
Kim et al.

(10) Patent No.: US 11,005,006 B2
(45) Date of Patent: May 11, 2021

(54) LIGHT EMITTING DIODE AND LIGHT EMITTING MODULE COMPRISING THE SAME

(71) Applicant: Seoul Semiconductor Co., Ltd., Ansan-si (KR)

(72) Inventors: Bang Hyun Kim, Ansan-si (KR); Young Hye Seo, Ansan-si (KR); Jae Ho Lee, Ansan-si (KR); Jong Min Lee, Ansan-si (KR); Seoung Ho Jung, Ansan-si (KR); Eui Sung Jeong, Ansan-si (KR)

(73) Assignee: Seoul Semiconductor Co., Ltd.

( * ) Notice: Subject to any disclaimer, the term of this patent is extended or adjusted under 35 U.S.C. 154(b) by 0 days.

(21) Appl. No.: 16/535,268

(22) Filed: Aug. 8, 2019

(65) Prior Publication Data
US 2019/0363230 A1    Nov. 28, 2019

Related U.S. Application Data

(63) Continuation of application No. PCT/KR2018/001653, filed on Feb. 7, 2018.

(30) Foreign Application Priority Data

Feb. 8, 2017    (KR) .................. 10-2017-0017652
Feb. 5, 2018    (KR) .................. 10-2018-0014070

(51) Int. Cl.
*H01L 33/08*    (2010.01)
*H01L 33/60*    (2010.01)
(Continued)

(52) U.S. Cl.
CPC ............... *H01L 33/08* (2013.01); *G02B 3/08* (2013.01); *H01L 33/20* (2013.01); *H01L 33/504* (2013.01);
(Continued)

(58) Field of Classification Search
CPC ......... H01L 33/08; H01L 33/44; H01L 33/46; H01L 33/50; H01L 33/505; H01L 33/507;
(Continued)

(56) References Cited

U.S. PATENT DOCUMENTS 8,492,781 B2    7/2013  Willemsen et al.
9,269,861 B2    2/2016  Lee et al.
(Continued)

FOREIGN PATENT DOCUMENTS

KR    10-2010-0113149    10/2010
KR    10-2014-0108172    9/2014
(Continued)

OTHER PUBLICATIONS

International Search Report dated May 29, 2018, in International Application No. PCT/KR2018/001653 (with English Translation).

*Primary Examiner* — Scott B Geyer
(74) *Attorney, Agent, or Firm* — H.C. Park & Associates, PLC

(57) ABSTRACT

A light emitting diode including a first light emitting region, and a second light emitting region spaced apart from and surrounding the first light emitting region, in which the first light emitting region and the second light emitting region are configured to be independently operated.

19 Claims, 10 Drawing Sheets

(51) Int. Cl.
  *G02B 3/08* (2006.01)
  *H01L 33/20* (2010.01)
  *H01L 33/50* (2010.01)
  *F21V 8/00* (2006.01)

(52) U.S. Cl.
  CPC ............ *H01L 33/505* (2013.01); *H01L 33/60* (2013.01); *G02B 6/0073* (2013.01)

(58) Field of Classification Search
  CPC ....... H01L 33/60; H01L 27/15; H01L 27/156; G02B 6/0078; G02B 6/0038; G02B 6/0073
  See application file for complete search history.

(56) References Cited

U.S. PATENT DOCUMENTS

| | | |
|---|---|---|
| 9,673,358 B2 | 6/2017 | Lee et al. |
| 2010/0309648 A1 | 12/2010 | Willemsen et al. |
| 2012/0193657 A1* | 8/2012 | von Malm ............ H01L 27/153 257/89 |
| 2015/0062949 A1 | 3/2015 | Lee et al. |
| 2016/0005931 A1 | 1/2016 | Lee et al. |

FOREIGN PATENT DOCUMENTS

| | | |
|---|---|---|
| KR | 10-2015-0007854 | 1/2015 |
| KR | 10-2015-0025798 | 3/2015 |
| KR | 10-1645858 | 8/2016 |

* cited by examiner

LIGHT EMITTING DIODE AND LIGHT EMITTING MODULE COMPRISING THE SAME

CROSS-REFERENCE TO RELATED APPLICATIONS

This application is a Bypass Continuation of International Patent Application No. PCT/KR2018/001653, filed on Feb. 7, 2018, and claims priority from and the benefit of Korean Patent Application No. 10-2017-0017652, filed on Feb. 8, 2017, and Korean Patent Application No. 10-2018-0014070, filed on Feb. 5, 2018, each of which is hereby incorporated by reference for all purposes fully set forth herein.

BACKGROUND

Field

Exemplary embodiments of the present invention relate to a light emitting diode and a light emitting module including the same, and more particularly, to a light emitting diode including a plurality of light emitting regions and a light emitting module including the light emitting diode.

Discussion of the Background

A typical light emitting module includes a lens disposed on a light emitting part having a single wavelength conversion layer formed on a single LED chip. For such a typical light emitting module, it is difficult to control a beam angle and to realize a variable correlated color temperature (CCT).

The above information disclosed in this Background section is only for understanding of the background of the inventive concepts, and, therefore, it may contain information that does not constitute prior art.

SUMMARY

Light emitting diodes constructed according to exemplary embodiments of the invention and a light emitting module including the same are capable of controlling beam angle and controlling color temperature.

Exemplary embodiments also provide a light emitting diode and a light emitting module including the same that are capable of controlling a luminous area and facilitating miniaturization.

Additional features of the inventive concepts will be set forth in the description which follows, and in part will be apparent from the description, or may be learned by practice of the inventive concepts.

A light emitting diode according to an exemplary embodiment includes a first light emitting region, and a second light emitting region spaced apart from and surrounding the first light emitting region, in which the first light emitting region and the second light emitting region are configured to be independently operated.

A center of the first light emitting region may overlap a center of the second light emitting region.

Each of the first light emitting region and the second light emitting region may include a first conductivity type semiconductor layer, an active layer, and a second conductivity type semiconductor layer, and the first and second light emitting regions may be configured to emit light in the same wavelength band.

Each of the first light emitting region and the second light emitting region may include a first conductivity type semiconductor layer, an active layer, and a second conductivity type semiconductor layer, and the first and second light emitting regions may be configured to emit light having a wavelength band different from each other.

The light emitting diode may further include a wavelength conversion layer covering the first light emitting region and the second light emitting region.

The first light emitting region and the second light emitting region may be coupled to each other by a single substrate, the substrate being disposed between the first and second light emitting regions and the wavelength conversion layer.

The wavelength conversion layer may include phosphors having substantially the same composition at portions corresponding to the first light emitting region and the second light emitting region.

The wavelength conversion layer may include a first wavelength conversion layer disposed on the first light emitting region and including a first phosphor, and a second wavelength conversion layer disposed on the second light emitting region to surround the first wavelength conversion layer and including a second phosphor.

The first wavelength conversion layer may cover the entire first light emitting region and a portion of the second light emitting region.

The first light emitting region and the first phosphor may be configured to emit light having a color temperature in a range of 2,300 K to 3,500 K, and the second light emitting region and the second phosphor may be configured to emit light having a color temperature in a range of 4,500 K to 6,500 K.

The first light emitting region may have a larger planar area than the second light emitting region.

The second light emitting region may include a plurality of light emitting cells surrounding the first light emitting region, the plurality of light emitting cells being configured to be independently operated through on/off control.

At least two light emitting cells that are symmetrically disposed with respect to the first light emitting region may be configured to be simultaneously operated through on/off control.

At least one of the first and second light emitting regions may include a plurality of light emitting cells configured to be independently operated through on/off control.

A light emitting module according to another exemplary embodiment includes a light emitting diode including a first light emitting region and a second light emitting region spaced apart from and surrounding the first light emitting region, and a monofocal lens disposed on the light emitting diode, in which the first light emitting region and the second light emitting region are configured to be independently operated.

The light emitting diode further may include a wavelength conversion layer covering the first light emitting region and the second light emitting region.

The wavelength conversion layer may include a first wavelength conversion layer corresponding to the first light emitting region and including a first phosphor, and a second wavelength conversion layer corresponding to the second light emitting region and including a second phosphor.

The second light emitting region may include a plurality of light emitting cells surrounding the first light emitting region, and the plurality of light emitting cells may be configured to be independently operated through on/off control to adjust a luminous area of the second light emitting region.

At least two light emitting cells that are disposed symmetrically with respect to the first light emitting region may be configured to be simultaneously operated through on/off control.

The light emitting module may further include a substrate including an electrode pattern, and a housing disposed on the substrate and including a cavity, in which the light emitting diode may be mounted inside the cavity.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
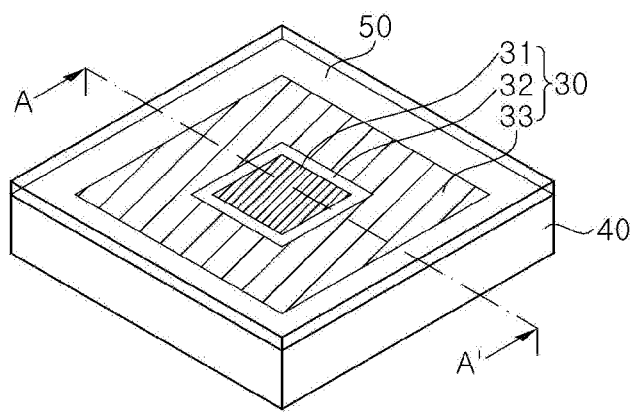
FIG. 1A and FIG. 1B are views of a light emitting diode according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present invention will be described in detail with reference to the accompanying drawings. The following embodiments are provided by way of example so as to fully convey the spirit of the present invention to those skilled in the art to which the present invention pertains. Accordingly, the present invention is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Hereinafter, exemplary embodiments of the present invention will be described in detail with reference to the accompanying drawings.

Figure 1B:
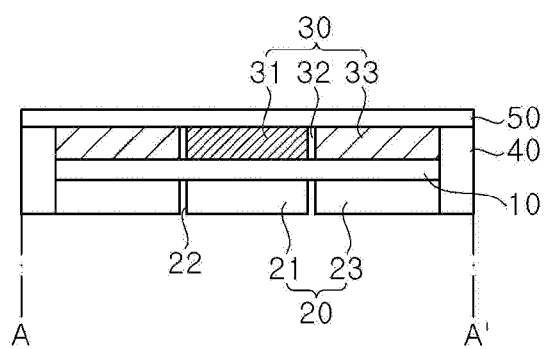

FIGS. 1A and 1B are view of a light emitting diode according to an exemplary embodiment. More particularly, FIG. 1A is a perspective view of a light emitting diode according to an exemplary embodiment, and FIG. 1B is a cross-sectional view taken along line A-A' of FIG. 1A.

The light emitting diode according to the illustrated exemplary embodiment has a chip scale package shape. The light emitting diode having the chip scale package shape is manufactured through a packaging process and a chip process, which will be described in more detail below.

The light emitting diode according to the illustrated exemplary embodiment may include a substrate 10, a light emitting structure 20 disposed on the substrate 10, and a wavelength conversion layer 30 covering the light emitting structure 20. In addition, the light emitting diode may further include a lateral reflective layer 40 surrounding a side surface of the light emitting structure 20, and a light spreading layer 50 covering an upper surface of the wavelength conversion layer 30.

The substrate 10 may be any substrates capable of growing a gallium nitride semiconductor layer thereon. For example, the substrate 10 may be a sapphire substrate, a silicon carbide substrate, a gallium nitride substrate, an aluminum nitride substrate, a silicon substrate, or the like. In addition, the substrate 10 may be a transparent substrate allowing transmission of light therethrough, and may have a roughness pattern formed on an upper surface thereof.

The light emitting structure 20 may include a first conductivity type semiconductor layer, a second conductivity type semiconductor layer, and an active layer interposed between the first conductivity type semiconductor layer and the second conductivity type semiconductor layer. For example, the first conductivity type semiconductor layer, the active layer, and the second conductivity type semiconductor layer may be sequentially stacked on the substrate 10.

The first conductivity type semiconductor layer may be a gallium nitride semiconductor layer doped with an n-type impurity, for example, Si, and the second conductivity type semiconductor layer may be a gallium nitride semiconductor layer doped with a p-type impurity, for example, Mg, or vice versa. The active layer may have a single quantum well structure or a multi-quantum well structure. The composition and thickness of well layers in the active layer may determine the wavelength of light generated from the active layer. In particular, the active layer may be formed to emit UV light, blue light, or green light through adjustments of the composition of the well layers.

The light emitting structure 20 may include a plurality of light emitting regions. For example, referring to FIG. 1B, the light emitting structure 20 may include a first light emitting region 21 and a second light emitting region 23. The second light emitting region 23 may be spaced apart from the first light emitting region 21 and may surround the first light emitting region 21. In this manner, the first light emitting region 21 and the second light emitting region 23 may have a common center. Hereinafter, each of the light emitting regions may be referred to as a light emitting cell.

The first light emitting region 21 and the second light emitting region 23 may be defined through a dividing groove 22. The second light emitting region 23 may be spaced apart from the first light emitting region 21 by the dividing groove 22. The dividing groove 22 may be formed to expose a portion of the first conductivity type semiconductor layer by etching an upper surface of the light emitting structure 20, that is, from the second conductivity type semiconductor layer to a portion of the first conductivity type semiconductor layer through the active layer. Alternatively, the dividing groove 22 may be formed to expose a portion of the substrate 10 by etching the light emitting structure from the second conductivity type semiconductor layer to the first conductivity type semiconductor layer through the active layer.

The dividing groove 22 may have a circular or rectangular closed-loop structure in a region on the upper surface of the light emitting structure 20. However, the inventive concepts are not limited to one shape of the dividing groove 22, and the dividing groove 22 may have various shapes of a closed-loop structure. When the dividing groove 22 has the closed-loop structure, the first light emitting region 21 may be disposed inside the dividing groove 22 and the second light emitting region 23 may be disposed outside the dividing groove 22.

In another exemplary embodiment, the second light emitting region 23 may be formed by etching the light emitting structure 20, and the first light emitting region 21 may be separately formed outside the second light emitting region 23 and coupled thereto, or vice versa. For example, referring to FIG. 1A, in order to define a region to which the first light emitting region 21 is coupled to, an inner region of the dividing groove 22 having a closed-loop structure may be removed by etching, and the first light emitting region 21 formed by a separate process may be connected to the inner region removed by etching, thereby forming the light emitting structure 20 including the plurality of light emitting regions. In this case, the first light emitting region 21 and the second light emitting region 23 may be formed to have substantially the same height. Alternatively, the first light emitting region 21 may be formed by etching the light emitting structure 20, and the second light emitting region 23 may be separately formed outside the first light emitting region 21 and coupled thereto. In the light emitting structure 20 formed by this method, the first light emitting region 21 and the second light emitting region 23 may emit light having the same or different wavelengths. For example, the active layer of the first light emitting region 21 and the active layer of the second light emitting region 23 may have different compositions, and thus, may emit light having different wavelengths.

Referring back to FIG. 1A, the first light emitting region 21 may be disposed at the center of the light emitting structure 20. The dividing groove 22 may be disposed along an outer circumference of the first light emitting region 21, and the second light emitting region 23 may be spaced apart from the first light emitting region 21 by the dividing groove 22 while surrounding the first light emitting region 21. In some exemplary embodiments, an insulation layer may be disposed on the dividing groove 22. The insulation layer may block unintended electrical connection between the first light emitting region 21 and the second light emitting region 23. For example, the insulation layer may block the active layer and the second conductivity type semiconductor layer of the first light emitting region 21 from being electrically connected to the active layer and the second conductivity type semiconductor layer of the second light emitting region 23. The insulation layer can improve reliability of the light emitting diode when the first light emitting region 21 and the second light emitting region 23 are independently operated.

In the light emitting structure 20, each of the light emitting regions, that is, the first light emitting region 21 and the second light emitting region 23, may be independently operated. More particularly, the first light emitting region 21 and the second light emitting region 23 may output the same or different magnitudes of power by receiving the same or different magnitudes of current and/or voltage. The first light emitting region 21 and the second light emitting region 23 may be individually operated through on/off control, whereby each of the first light emitting region 21 and the second light emitting region 23 can be independently turned on or both the first light emitting region 21 and the second light emitting region 23 can be simultaneously turned on.

For example, when larger magnitudes of voltage and/or current are supplied to the first light emitting region 21 than to the second light emitting region 23, the first light emitting region 21 disposed at the center of the light emitting structure 20 may output greater power than the second light emitting region 23. As such, light emitted from the light emitting diode may have a narrower beam angle than when the same magnitudes of voltage and/or current are supplied to the first light emitting region 21 and the second light emitting region 23. In order to form a narrow beam angle, for example, the current may be supplied only to the first light emitting region 21 while blocking current supply to the second light emitting region 23.

As another example, when larger magnitudes of voltage and/or current are supplied to the second light emitting region 23 than to the first light emitting region 21, the second light emitting region 23 disposed along the outer circumference of the light emitting structure 20 may output greater power than the first light emitting region 21. Accordingly, light emitted from the light emitting diode may have a broader beam angle than when the same magnitudes of voltage and/or current are supplied to the first light emitting region 21 and the second light emitting region 23.

Accordingly, when the light emitting structure 20 has the second light emitting region 23 surrounding the first light emitting region 21, the light emitting diode according to the illustrated exemplary embodiment can change the beam angle of light emitted therefrom through adjustment of the magnitudes of voltage and/current to be supplied to the first light emitting region 21 and the second light emitting region 23.

As described above, in order to allow the first light emitting region 21 and the second light emitting region 23 to be independently operated, the light emitting diode may include a first electrode pair electrically connected to the first conductivity type semiconductor layer and the second conductivity type semiconductor layer in the first light emitting region 21, and a second electrode pair electrically connected to the first conductivity type semiconductor layer and the second conductivity type semiconductor layer in the second light emitting region 23. In this case, the first light emitting region 21 may receive the voltage and/or current through the first electrode pair from an external power source to be operated independently of the second light emitting region 23, and the second light emitting region 23 may receive the voltage and/or current through the second electrode pair from the external power source to be operated independently of the first light emitting region 21.

Alternatively, in order to allow the first light emitting region 21 and the second light emitting region 23 to be independently operated, the light emitting diode may include a common electrode electrically connected to both the first light emitting region 21 and the second light emitting region 23. For example, the common electrode may be commonly connected to the first conductivity type semiconductor layer (or the second conductivity type semiconductor layer) of the first light emitting region 21 and to the first conductivity type semiconductor layer (or the second conductivity type semiconductor layer) of the second light emitting region 23. In this case, the light emitting diode may further include a first electrode electrically connected to the second conductivity type semiconductor layer (or the first conductivity type semiconductor layer) of the first light emitting region 21 and a second electrode electrically connected to the second conductivity type semiconductor layer (or the first conductivity type semiconductor layer) of a second light emitting region 23.

As another example, the common electrode may be commonly connected to the first conductivity type semiconductor layer (or the second conductivity type semiconductor layer) of the first light emitting region 21 and to the second conductivity type semiconductor layer (or the first conductivity type semiconductor layer) of the second light emitting region 23. In this case, the light emitting diode may further include a first electrode electrically connected to the second conductivity type semiconductor layer (or the first conductivity type semiconductor layer) of the first light emitting region 21 and a second electrode electrically connected to the first conductivity type semiconductor layer (or the second conductivity type semiconductor layer) of the second light emitting region 23.

The wavelength conversion layer 30 covers an upper surface of the light emitting structure 20. As used herein, the upper surface of the light emitting structure 20 may refer to a main light exit surface. Referring to FIG. 1B, the substrate 10 is disposed on the main light exit surface of the light emitting structure 20, that is, on the upper surface thereof. In this case, the substrate 10 may be a transparent substrate and the wavelength conversion layer 30 may cover the substrate 10. In another exemplary embodiment, the substrate 10 may be disposed under the light emitting structure 20. In this case, the main light exit surface of the light emitting structure 20 may be a surface opposing a surface of the light emitting structure to which the substrate 10 is disposed. In addition, the wavelength conversion layer 30 may be disposed on the light emitting structure 20. In some exemplary embodiments, the substrate 10 may be removed and the wavelength conversion layer 30 may cover the upper surface of the light emitting structure 20.

The wavelength conversion layer 30 includes a phosphor, which can change the wavelength of light emitted from a light emitting diode chip. The wavelength conversion layer 30 may have a predetermined thickness or more to prevent the phosphor from being exposed to the outside and be deformed and/or discolored.

Referring to FIGS. 1A and 1B, the wavelength conversion layer 30 may include two regions corresponding to the two light emitting regions of the light emitting structure 20. More particularly, the wavelength conversion layer 30 may include a first wavelength conversion layer 31 corresponding to the first light emitting region 21 and a second wavelength conversion layer 33 corresponding to the second light emitting region 23. The wavelength conversion layer 30 may have a structure, in which the first wavelength conversion layer 31 is disposed in a central region and the second wavelength conversion layer 33 surrounds the first wavelength conversion layer 31, to conform to the configuration of the light emitting regions 21 and 23.

The wavelength conversion layer 30 may further include a barrier layer 32 interposed between the first wavelength conversion layer 31 and the second wavelength conversion layer 33. The barrier layer 32 may facilitate light spreading and mixing of light of different wavelengths emitted from the first wavelength conversion layer 31 and the second wavelength conversion layer 33. The barrier layer 32 can minimize rapid occurrence of color deviation or light variation at the interface between the first wavelength conversion layer 31 and the second wavelength conversion layer 33. The barrier layer 32 may be formed with any material capable of light spreading. The barrier layer 32 may be disposed on the dividing groove 22 of the light emitting structure 20.

The wavelength conversion layer 30 may be formed as a sheet by screen printing and the like. For example, a sheet of the first wavelength conversion layer 31 may be prepared and partially removed to define a region for the second wavelength conversion layer 33. Then, the second wavelength conversion layer 33 is formed in a region where the sheet of the first wavelength conversion layer 31 is partially removed, thereby providing one sheet of the wavelength conversion layer 30. Alternatively, a sheet of the second wavelength conversion layer 33 is prepared and partially removed to define a region for the first wavelength conversion layer 31. Then, the first wavelength conversion layer 31 is formed in the region from where the sheet of the second wavelength conversion layer 33 is partially removed, thereby providing one sheet of the wavelength conversion layer 30.

As another example, the first wavelength conversion layer 31 is formed on an upper side of the first light emitting region 21. In this case, in order to form the first wavelength conversion layer 31 on the upper side of the first light emitting region 21, a mask or the like may be used to prevent formation of the first wavelength conversion layer 31 on the second light emitting region 23. When using the mask or the like, a process of removing the mask from the second light emitting region 23 may be performed before formation of the second wavelength conversion layer 31. Then, the second wavelength conversion layer 33 is formed over the entire region. More particularly, the second wavelength conversion layer 33 is formed not only on an upper side of the second light emitting region 23, but also on an upper side of the first wavelength conversion layer 31 formed on the first light emitting region 21. Then, a single wavelength conversion layer 30 may be formed by etching the second wavelength conversion layer 33 formed on the first wavelength conversion layer 31, or etching the second wavelength conversion layer 33 until the first wavelength conversion layer 31 is exposed. The second wavelength conversion layer 33 on the second light emitting region 23 may be formed to have substantially the same thickness as the first wavelength conversion layer 31 on the first light emitting region 21.

As another example, the second wavelength conversion layer 33 may be formed on an upper side of the second light emitting region 23. A mask or the like may be used to block the upper side of the first light emitting region 21. Then, the mask is removed and the first wavelength conversion layer 31 is formed over the entire region. In particular, the first wavelength conversion layer 31 is formed not only on an upper side of the first light emitting region 21, but also on an upper side of the second wavelength conversion layer 33 formed on the second light emitting region 23. Then, a single wavelength conversion layer may be formed by etching the first wavelength conversion layer 31 formed on the second wavelength conversion layer 33, or by etching the first wavelength conversion layer 31 until the second wavelength conversion layer 33 is exposed. The first wavelength conversion layer 31 on the first light emitting region 21 may be formed to have substantially the same thickness as the second wavelength conversion layer 33 on the second light emitting region 23.

The first wavelength conversion layer 31 may include a first phosphor and the second wavelength conversion layer 33 may include a second phosphor, which may be different from the first phosphor. For example, the first phosphor in the first wavelength conversion layer 31 may cause warm white light having a color temperature of 2,300K to 3,500K to be emitted through wavelength conversion of light emitted from the first light emitting region 21. In an exemplary embodiment, the first phosphor may cause warm white light having a color temperature of 2,700K to 3,500K to be emitted. Alternatively, warm white light exhibiting an amber color may be realized through the first light emitting region 21 and the first wavelength conversion layer 31.

The second phosphor in the second wavelength conversion layer 33 may cause cool white light having a color temperature of 4,500K to 6,500K to be emitted through wavelength conversion of light emitted from the second light emitting region 23. In an exemplary embodiment, the second phosphor may cause cool white light having a color temperature of 5,000K to 6,000K to be emitted.

However, the inventive concepts are not limited thereto. For example, the first phosphor in the first wavelength conversion layer 31 may cause cool white light having a color temperature of 4,500K to 6,500K to be emitted through wavelength conversion of light emitted from the first light emitting region 21. The second phosphor in the second wavelength conversion layer 33 may cause warm white light having a color temperature of 2,300K to 3,500K to be emitted through wavelength conversion of light emitted from the second light emitting region 23.

As described above, the first light emitting region 21 and the second light emitting region 23 may be independently operated, and thus, may output different magnitudes of power. For example, when warm white light is realized through combination of light emitted from the first light emitting region 21 and the first wavelength conversion layer 30, and cool white light is realized through combination of light emitted from the second light emitting region 23 and the second wavelength conversion layer 30 (or vice versa), the color temperature or the correlated color temperature (CCT) of light emitted from the light emitting diode may be adjusted through adjustment of input voltage and/or current applied to the first light emitting region 21 and the second light emitting region 23.

For example, when warm white light is realized through combination of light emitted from the first light emitting region 21 and the first wavelength conversion layer 30, and cool white light is realized through combination of light emitted from the second light emitting region 23 and the second wavelength conversion layer 30, the light emitting diode may emit white light having a color temperature of 2,300K to 3,500K, when external power is applied to the first light emitting region 21 but not to the second light emitting region 23.

On the other hand, when external power is applied to the second light emitting region 23 but not to the first light emitting region 21, the light emitting diode may emit white light having a color temperature of 4,500K to 6,500K.

When external power is applied to both the first light emitting region 21 and the second light emitting region 23, the light emitting diode may emit light having a color temperature in the middle range between warm white and cool white. When the light emitting diode includes the second light emitting region 23 surrounding the first light emitting region 21, and the light spreading layer 50 has the to be described below, the light emitting diode can achieve efficient mixing of two colors.

The lateral reflective layer 40 may cover the side surface of the light emitting structure 20. In addition, the lateral reflective layer 40 may cover a side surface of the wavelength conversion layer 30 covering the upper surface of the light emitting structure 20. The lateral reflective layer 40 reflects light emitted toward the side surface of the light emitting structure 20, such that the reflected light is directed toward the upper surface of the light emitting structure 20. The beam angle of light emitted from the light emitting diode can be restricted by the lateral reflective layer 40.

According to an exemplary embodiment, the lateral reflective layer 40 may include a wall formed of a resin material. The wall of the lateral reflective layer 40 may be formed in various colors, such as white. When the lateral reflective layer 40 includes the white wall formed of the resin material, the lateral reflective layer 40 may have a predetermined thickness or more to improve the reliability in blocking or reflecting light traveling toward the side surface of the light emitting structure 20. This is because the lateral reflective layer 40 having a small thickness allows some fraction of light to pass through the lateral reflective layer 40 formed of the resin material. For example, the lateral reflective layer 40 may have a thickness of 50 μm or more.

In some exemplary embodiments, the lateral reflective layer 40 may include a metal reflective layer, which may include Ag or Al, for example, which has high reflectivity. In this case, the lateral reflective layer 40 including the metal reflective layer can block and reflect light even with a thickness of several micrometers or less. For example, the lateral reflective layer 40 may be formed to a thickness of 5 μm or less, specifically 1 μm to 2 μm. When the lateral reflective layer 40 includes the metal reflective layer formed of a metallic material, the lateral reflective layer 40 may have a lower possibility of cracking as compare to that including the white wall formed of resin.

The light spreading layer 50 may cover an upper surface of the wavelength conversion layer 30 disposed on the light emitting structure 20. In addition, the light spreading layer 50 may extend in the horizontal direction to cover an upper surface of the lateral reflective layer 40.

The light spreading layer 50 may mix light components having different color temperatures. For example, the light spreading layer 50 may mix warm white light realized through combination of the first light emitting region 21 and the first wavelength conversion layer 30 with cool white light realized through combination of the second light emitting region 23 and the second wavelength conversion layer 30. In this case, the degree of color mixing may be adjusted depending upon the concentration of the light spreading layer 50. For example, when the light spreading layer 50 has a high concentration, the degree of mixing the warm white light with the cool white light may be high, and when the light spreading layer 50 has a low concentration, the degree of mixing the warm white light with the cool white light may be low.

FIGS. 2A to 2D exemplarily show a method of manufacturing the light emitting diode of FIG. 1A.

Figure 2A:
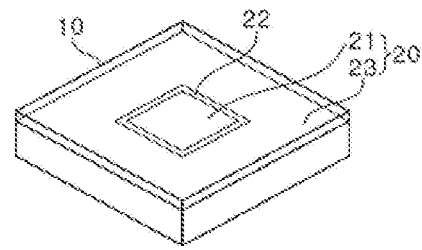
FIG. 2A, FIG. 2B, FIG. 2C, and FIG. 2D are views illustrating a method of manufacturing the light emitting diode of FIG. 1A.

Referring to FIG. 2A, a substrate 10 and a light emitting structure 20 disposed on the substrate 10 are prepared. The light emitting structure 20 may include a plurality of light emitting regions. The light emitting structure 20 may include a first light emitting region 21 and a second light emitting region 23 surrounding the first light emitting region 21. The first light emitting region 21 may be spaced apart from the second light emitting region 23 on the substrate.

According to the illustrated exemplary embodiment, the first light emitting region 21 and the second light emitting region 23 may be defined by a dividing groove 22 formed by etching a portion of the light emitting structure 20. The dividing groove 22 may be formed by etching the light emitting structure 20 from the upper surface of the light emitting structure 20 in a downward direction. Each of the light emitting regions 21, 23 may include the substrate 10, a first conductivity type semiconductor layer, an active layer, and a second conductivity type semiconductor layer sequentially stacked thereon.

The dividing groove 22 may be formed to expose a portion of the first conductivity type semiconductor layer by etching the upper surface of the light emitting structure 20, that is, from the second conductivity type semiconductor layer to a portion of the first conductivity type semiconductor layer through the active layer. Alternatively, the dividing groove 22 may be formed to expose a portion of the substrate by etching the light emitting structure from the second conductivity type semiconductor layer to the first conductivity type semiconductor layer through the active layer. The dividing groove 22 may have a rectangular closed-loop structure in a region on the upper surface of the light emitting structure 20. The first light emitting region 21 may be disposed inside the dividing groove 22, and the second light emitting region 23 may be disposed outside the dividing groove 22.

In another exemplary embodiment, the second light emitting region 23 may be formed by etching the light emitting structure 20, and the first light emitting region 21 may be separately formed outside the second light emitting region 23 and coupled thereto, or vice versa. For example, referring to FIG. 2A, in order to define a region to which the first light emitting region 21 is coupled, an inner region of the dividing groove 22 having a closed-loop structure may be removed by etching, and the first light emitting region 21 formed by a separate process may be coupled to the inner region removed by etching, thereby forming the light emitting structure 20 including the plurality of light emitting regions. In this case, the first light emitting region 21 and the second light emitting region 23 may be formed to have substantially the same height. Alternatively, the first light emitting region 21 may be formed by etching the light emitting structure 20, and the second light emitting region 23 may be separately formed outside the first light emitting region 21 and coupled thereto.

In this manner, the first light emitting region 21 and the second light emitting region 23 may emit light having the same or different wavelengths. That is, the active layer of the first light emitting region 21 and the active layer of the second light emitting region 23 may have different compositions, and thus, may emit light having different wavelengths.

In some exemplary embodiments, an insulation layer may be disposed on the dividing groove 22. The insulation layer may block unintended electrical connection between the first light emitting region 21 and the second light emitting region 23. The insulation layer can improve the reliability of the light emitting diode including the first light emitting region 21 and the second light emitting region 23 that may be independently operated.

Figure 2B:
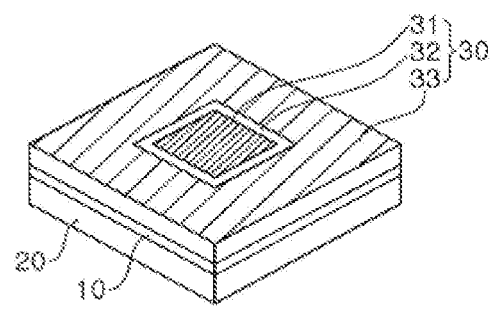

Referring to FIG. 2B, a wavelength conversion layer 30 may be formed on the upper surface of the light emitting structure 20. The wavelength conversion layer 30 may include a first wavelength conversion layer 31 corresponding to the first light emitting region 21 of the light emitting structure 20, and a second wavelength conversion layer 33 corresponding to the second light emitting region 23 of the light emitting structure 20. In addition, the wavelength conversion layer 30 may further include a barrier layer 32 interposed between the first wavelength conversion layer 31 and the second wavelength conversion layer 33. The barrier layer 32 may facilitate light spreading and mixing of light having different wavelengths emitted from the first wavelength conversion layer 31 and the second wavelength conversion layer 33. The first wavelength conversion layer 31 may have the same or similar shape and area to the first light emitting region 21, and the second wavelength conversion layer 33 may have the same or similar shape and area to the second light emitting region 23. The wavelength conversion layer 30 may be formed as a sheet through a printing process or the like. The wavelength conversion layer 30 may be directly formed on the light emitting structure 20 or may be separately prepared and be attached to the light emitting structure 20. The first wavelength conversion layer 31 may include a first phosphor and the second wavelength conversion layer 33 may include a second phosphor. The first phosphor and the second phosphor may include a mixture of phosphors having different compositions. As such, the light emitting diode includes two light components that can emit light having different color temperatures.

Figure 2C:
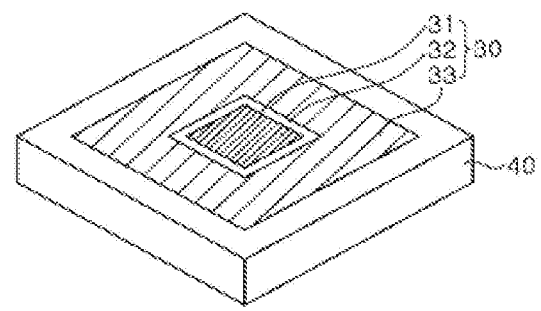

Referring to FIG. 2C, a lateral reflective layer 40 may be formed to cover a side surface of the light emitting structure 20. The lateral reflective layer 40 may cover not only the side surface of the light emitting structure 20, but also a side surface of the wavelength conversion layer 30 covering the upper surface of the light emitting structure 20. The lateral reflective layer 40 may include a wall formed of a resin material. The wall may have be formed to have various colors, such as white. In some exemplary embodiments, the lateral reflective layer 40 may include a metal reflective layer including Ag or Al, which has high reflectivity. The lateral reflective layer 40 may restrict the beam angle of the light emitting diode by blocking and reflecting light emitted toward the side surface of the light emitting structure 20.

Figure 2D:
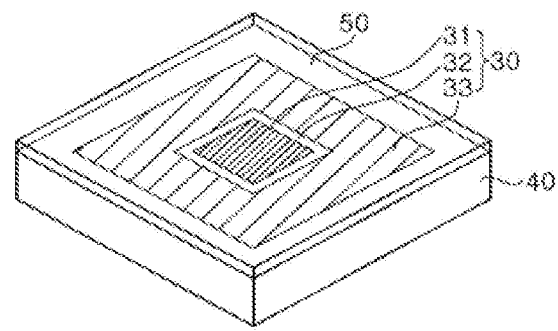

Referring to FIG. 2D, a light spreading layer 50 may be formed to cover an upper surface of the wavelength conversion layer 30. The light spreading layer 50 may be formed to extend in the horizontal direction to cover not only the upper surface of the wavelength conversion layer 30, but also an upper surface of the lateral reflective layer 40. The light spreading layer 50 may mix two light components having different color temperatures.

Figure 3A:
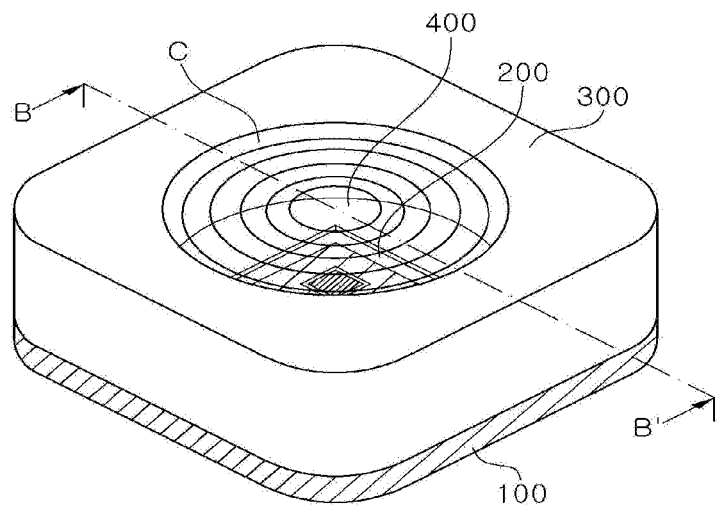
FIG. 3A and FIG. 3B are views of a light emitting module according to an exemplary embodiment.
Figure 3B:
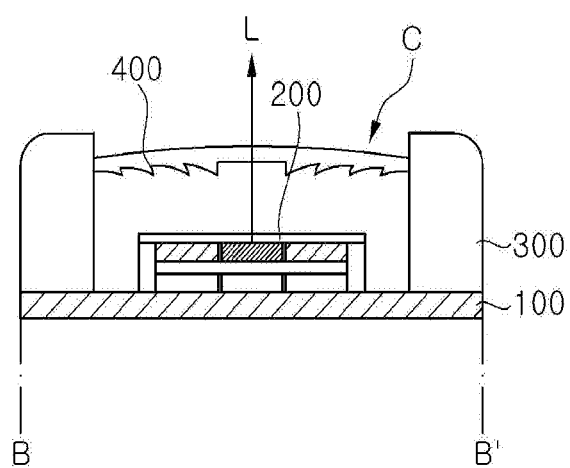

FIGS. 3A and 3B are view of a light emitting module according to an exemplary embodiment. More particularly, FIG. 3A is a perspective view of the light emitting module according to an exemplary embodiment, and FIG. 3b is a cross-sectional view taken along line B-B' of FIG. 3A.

Referring to FIGS. 3A and 3B, the light emitting module may include a base substrate 100, a light emitting diode 200, a housing 300, and a lens 400.

The base substrate 100 may include an insulation substrate. The insulation substrate may be a ceramic substrate, for example, an AlN substrate. The AlN substrate has good durability at high temperature and good heat dissipation characteristics. The base substrate 100 may include an electrode pattern.

The light emitting diode 200 may include a substrate, a light emitting structure 20 including a first light emitting region 21 and a second light emitting region 23, a wavelength conversion layer 30 covering the light emitting structure 20 and including a first the wavelength conversion layer 31 and a second the wavelength conversion layer 33, and a lateral reflective layer 40 surrounding side surfaces of the light emitting structure 20 and the wavelength conversion layer 30. In addition, the light emitting structure 20 may further include a light spreading layer 50 covering an upper surface of the wavelength conversion layer 30 and an upper surface of the lateral reflective layer 40. For example, the light emitting diode 200 may include the light emitting diode, as shown in FIGS. 1 to 2D.

The light emitting diode 200 may include electrodes electrically connected to the electrode pattern of the base substrate 100. For example, the light emitting diode 200 may include a first electrode pair electrically connected to the first conductivity type semiconductor layer and the second conductivity type semiconductor layer in the first light emitting region 21. In addition, the light emitting diode 200 may include a second electrode pair electrically connected to the first conductivity type semiconductor layer and the second conductivity type semiconductor layer in the second light emitting region 23. The first electrode pair and the second electrode pair may be electrically connected to the electrode pattern of the base substrate 100, such that the first light emitting region 21 and the second light emitting region 23 of the light emitting diode 200 may be independently operated.

In some exemplary embodiments, the light emitting diode 200 may include a common electrode electrically connected to both of the first light emitting region 21 and the second light emitting region 23. The common electrode may be commonly connected to the first conductivity type semiconductor layer (or the second conductivity type semiconductor layer) of the first light emitting region 21 and to the first conductivity type semiconductor layer (or the second conductivity type semiconductor layer) of the second light emitting region 23. In this case, the light emitting diode 200 may further include a first electrode electrically connected to the second conductivity type semiconductor layer (or the first conductivity type semiconductor layer) of the first light emitting region 21 and a second electrode electrically connected to the second conductivity type semiconductor layer (or the first conductivity type semiconductor layer) of the second light emitting region 23.

Alternatively, the common electrode may be commonly connected to the first conductivity type semiconductor layer (or the second conductivity type semiconductor layer) of the first light emitting region 21 and to the second conductivity type semiconductor layer (or the first conductivity type semiconductor layer) of the second light emitting region 23. In this case, the light emitting diode may further include a first electrode electrically connected to the second conductivity type semiconductor layer (or the first conductivity type semiconductor layer) of the first light emitting region 21 and a second electrode electrically connected to the first conductivity type semiconductor layer (or the second conductivity type semiconductor layer) of the second light emitting region 23.

Through the connection structure between the electrodes of the light emitting diode 200 and the electrode pattern of the base substrate 100, the first light emitting region 21 and the second light emitting region 23 may be independently operated by independently receiving voltage and/or current from an external power source. That is, the first light emitting region 21 and the second light emitting region 23 can output different magnitudes of power, or only one of the first light emitting region 21 and the second light emitting region 23 can be operated.

The housing 300 may include a cavity C defining a region in which the light emitting diode 200 is mounted. The cavity C may be formed at the center of the light emitting module. The cavity C may be surrounded by a sidewall. The sidewall may be formed substantially perpendicular to the base substrate 100. Alternatively, the sidewall may have a slanted surface to reflect light emitted from the light emitting diode 200. In addition, the cavity C may have a rotational symmetry shape, particularly a substantially circular shape. As used herein, the rotational symmetry does not only refer to a rotary body but also refers to a structure maintaining the same shape when rotated at a certain angle, for example, 60 degrees, 90 degrees, 130 degrees, or 180 degrees. However, the inventive concepts are not limited to a particularly shape of the cavity C, and the cavity C may be formed to have various shapes, as needed.

The lens 400 may include a monofocal lens. More specifically, the lens 400 may include a Fresnel lens.

When the light emitting diode includes the second light emitting region 23 surrounding the first light emitting region 21, light emitted from the light emitting diode can be collected through the monofocal lens. That is, the first light emitting region 21 and the second light emitting region 23 surrounding the first light emitting region 21 have a common center. As such, not only light emitted from the first light emitting region 21, but also light emitted from the second light emitting region 23 can be collected through the monofocal lens. Referring to FIG. 3B, it can be seen that an optical axis L of the light emitting structure 20 is coincident with the focal point of the lens 400.

The light emitting module according to an exemplary embodiment can achieve miniaturization of the lens and cost reduction using the monofocal lens. In addition, the light emitting module using the monofocal lens 500 can achieve efficient mixing of colors.

Figure 4A:
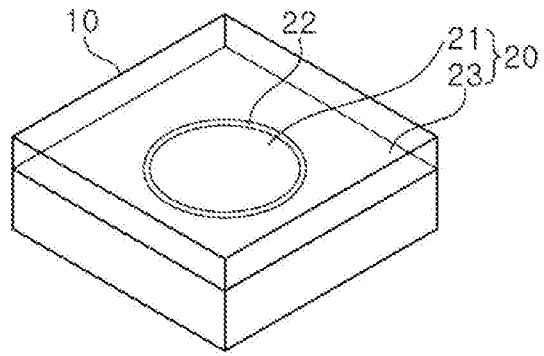
FIG. 4A and FIG. 4B are views of a light emitting diode according to another exemplary embodiment.
Figure 4B:
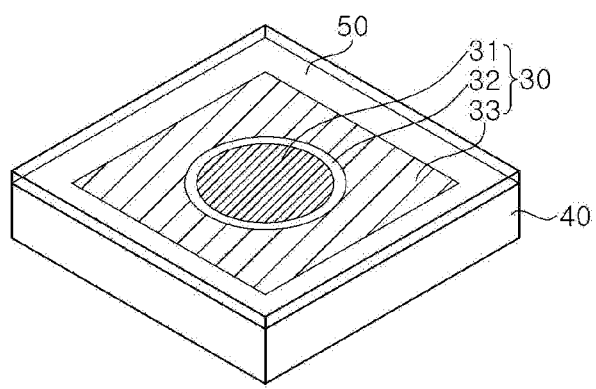

FIGS. 4A and 4B are views of a light emitting diode according to another exemplary embodiment. Most components of the light emitting diode according to the illustrated exemplary embodiment are similar to those of the light emitting diode shown in FIGS. 1A to 2D, excluding the shapes of the light emitting regions and the wavelength conversion layer 30 of the light emitting structure 20. As such, the following description will be focused on different features, and repeated descriptions of substantially the same components will be omitted to avoid redundancy.

FIG. 4A is a perspective view of the light emitting structure 20, illustrating the shapes of the light emitting regions according to the illustrated exemplary embodiment. Referring to FIG. 4A, the light emitting structure 20 includes two light emitting regions, that is, a first light emitting region 21 and a second light emitting region 23. As compared to the light emitting diode of FIGS. 1A to 2D, the first light emitting region 21 of the light emitting diode according to the illustrated exemplary embodiment has a substantially circular shape in plan view. More particularly, a dividing groove 22 defining the first light emitting region 21 and the second light emitting region 23 may have a circular closed-loop structure. As shown in FIGS. 3A and 3B, since the lens 400 has a circular focal point, the first light emitting region 21 is formed in a circular shape, thereby improving light uniformity upon operation of the light emitting diode coupled to the lens 400.

The first light emitting region 21 and the second light emitting region 23 may be defined by the dividing groove 22 formed by etching a portion of the light emitting structure 20. Referring to FIG. 4A, the dividing groove 22 may have a circular closed-loop structure. In some exemplary embodiments, an insulation layer may be disposed on the dividing groove 22. The insulation layer may block unintended electrical connection between the first light emitting region 21 and the second light emitting region 23. The insulation layer can improve the reliability of the light emitting diode including the first light emitting region 21 and the second light emitting region 23 that may be independently operated.

FIG. 4B is a perspective view of the light emitting diode, illustrating the wavelength conversion layer 30 according to the illustrated exemplary embodiment. Referring to FIG. 4B, the wavelength conversion layer 30 may cover the light emitting structure 20. The wavelength conversion layer 30 may include a first wavelength conversion layer 31 corresponding to the first light emitting region 21, and a second wavelength conversion layer 33 corresponding to the second light emitting region 23. In addition, the wavelength conversion layer 30 may further include a barrier layer 32 to facilitate spreading of light having different wavelengths. The first wavelength conversion layer 31 may have the same or similar shape and area to the first light emitting region 21, and the second wavelength conversion layer 30 may have the same or similar shape and area to the second light emitting region 23. The first wavelength conversion layer 31 may include a first phosphor and the second wavelength conversion layer 33 may include a second phosphor. The first phosphor and the second phosphor may include different phosphor compositions.

Referring to FIG. 4B, the lateral reflective layer 40 may surround the side surface of the light emitting structure 20. In addition, the lateral reflective layer 40 may surround not only the side surface of the light emitting structure 20, but also the side surface of the wavelength conversion layer 30. The light spreading layer 50 may cover the upper surface of the light emitting structure 20 and may extend in the horizontal direction to cover the upper surface of the lateral reflective layer 40.

The light emitting diode according to the illustrated exemplary embodiment can be modularized through a monofocal lens, as in the light emitting diode shown in FIGS. 1A to 2D.

Figure 5A:
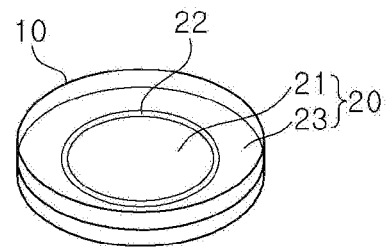
FIG. 5A and FIG. 5B are views of a light emitting diode according to a further another exemplary embodiment.
Figure 5B:
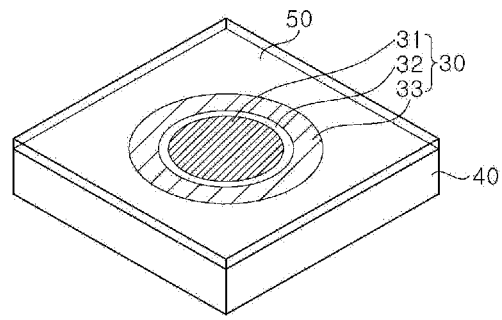

FIGS. 5A and 5B are views of a light emitting diode according to a further exemplary embodiment. The light emitting diode according to the illustrated exemplary embodiment is different from the light emitting diode of FIGS. 4A and 4B in terms of the shapes of the second light emitting region 23 and the second wavelength conversion layer 33 of the light emitting structure 20. As such, the following description will be focused on different features, and thus, repeated descriptions of substantially the same components will be omitted.

FIG. 5A is a perspective view of the light emitting structure 20, illustrating the shapes of the light emitting regions according to the illustrated exemplary embodiment. Referring to FIG. 5A, the second light emitting region 23 may surround the first light emitting region 21. The second light emitting region 23 according to the illustrated exemplary embodiment has a circular outer circumference unlike the second light emitting region 23 shown in FIGS. 4A and 4B. More particularly, the outer circumference of the first light emitting region 21 and the outer circumference of the second light emitting region 23 may have concentric circular shapes having a common center. In some exemplary embodiments, an insulation layer may be disposed on the dividing groove 22. The insulation layer may block unintended electrical connection between the first light emitting region 21 and the second light emitting region 23. As the first light emitting region 21 has a circular shape and the second light emitting region 23 also has a circular shape sharing the center of the first light emitting region 21, the light emitting diode according to the illustrated exemplary embodiment may have an improved light uniformity, as compared with the light emitting diode of FIGS. 4A and 4B.

FIG. 5B is a perspective view of the light emitting diode, illustrating the wavelength conversion layer 30. The wavelength conversion layer 30 may include a first wavelength conversion layer 31 corresponding to the first light emitting region 21 and a second wavelength conversion layer 33 corresponding to the second light emitting region 23. In addition, the wavelength conversion layer 30 may further include a barrier layer 32 to facilitate spreading of light having different wavelengths. The first wavelength conversion layer 31 may have the same or similar shape and area to the first light emitting region 21, and the second wavelength conversion layer 30 may have the same or similar shape and area to the second light emitting region 23. In particular, the outer circumference of the second wavelength conversion layer 33 may have a circular shape corresponding to the outer circumference of the second light emitting region 23.

Referring to FIG. 5B, the lateral reflective layer 40 may surround the side surface of the light emitting structure 20. In addition, the lateral reflective layer may surround not only the side surface of the light emitting structure 20, but also the side surface of the wavelength conversion layer 30. The lateral reflective layer 40 may have a substantially rectangular outer circumference. The light spreading layer 50 may cover the upper surface of the light emitting structure 20 and may extend in the horizontal direction to cover the upper surface of the lateral reflective layer 40.

The light emitting diode according to the illustrated exemplary embodiment can be modularized through a monofocal lens, like the light emitting diode shown in FIGS. 1A to 2D.

Figure 6A:
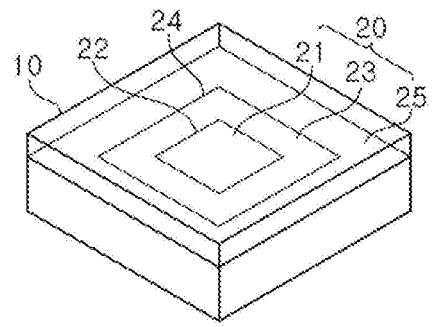
FIG. 6A and FIG. 6B are views of a light emitting diode according to yet another exemplary embodiment.
Figure 6B:
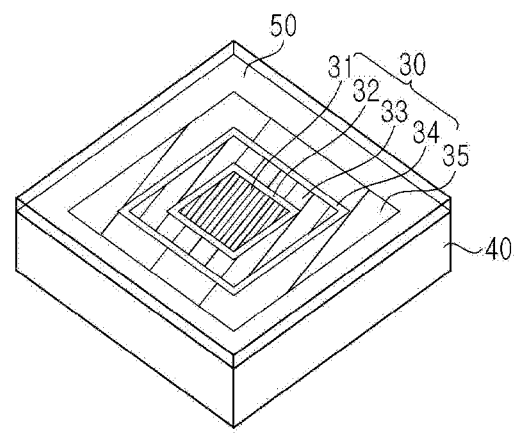

FIGS. 6A and 6B are views of a light emitting diode according to yet another exemplary embodiment. Most components of the light emitting diode according to the illustrated exemplary embodiment are similar to those of the light emitting diode of FIGS. 1A to 2D, excluding the light emitting regions and the wavelength conversion layer. As such, the following description will be focused on different features, and repeated descriptions of substantially the same components will be omitted.

FIG. 6A is a perspective view of the light emitting structure 20, illustrating the shapes of the light emitting regions according to the illustrated exemplary embodiment. Referring to FIG. 6A, the light emitting structure 20 includes three light emitting regions, that is, a first light emitting region 21, a second light emitting region 23, and a third light emitting region 25. The first light emitting region 21, the second light emitting region 23, and the third light emitting region 25 may emit light having the same or different wavelengths. The first light emitting region 21, the second light emitting region 23, and the third light emitting region 25 may be defined by a first dividing groove 22 and a second dividing groove 24 formed by partially etching the light emitting structure 20.

Referring to FIG. 6Aa, the first dividing groove 22 and the second dividing groove 24 may have a rectangular closed-loop structure. The first dividing groove 22 and the second dividing groove 24 may be formed by, for example, etching the second conductivity type semiconductor layer and the active layer, and partially etching the first conductivity type semiconductor layer. In this case, some region of the first conductivity type semiconductor layer may be exposed through the first dividing groove 22 and the second dividing groove 24. Alternatively, the first dividing groove 22 and the second dividing groove 24 may be formed by etching the second conductivity type semiconductor layer, the active layer, and the first conductivity type semiconductor layer. In this case, some region of the substrate 10 may be exposed through the first dividing groove 22 and the second dividing groove 24.

In some exemplary embodiments, the second light emitting region 23 and the third light emitting region 25 may be defined by etching the light emitting structure 20, and the first light emitting region 21 may be separately formed outside the second light emitting region 23 and the third light emitting region 25 and coupled thereto. For example, referring to FIG. 6A, in order to define a region to which the first light emitting region 21 is coupled, an inner region of the first dividing groove 22 having a closed-loop structure may be removed by etching. Then, the first light emitting region 21 formed by a separate process may be connected to the inner region removed by etching, thereby forming the light emitting structure 20 including the plurality of light emitting regions. In addition, the second light emitting region 23 and the third light emitting region 25 may be divided by the second dividing groove 24 having a closed-loop structure. In the case, the first light emitting region 21 may emit light having different wavelengths than light emitted from the second light emitting region 23 and the third light emitting region 25.

In some exemplary embodiments, the third light emitting region 25 may be defined by etching the light emitting structure 20, and the first light emitting region 21 and the second light emitting region 23 may be separately formed outside the third light emitting region 25 and coupled thereto. For example, referring to FIG. 6A, in order to define a region to which the first light emitting region 21 and the second light emitting region 23 are coupled, an inner region of the second dividing groove 24 having a closed-loop structure may be removed by etching. Then, the first light emitting region 21 and the second light emitting region 23 formed by separate process may be connected to the inner region removed by etching, thereby forming the light emitting structure 20 including the plurality of light emitting regions. In this case, the first light emitting region 21 and the second light emitting region 23 may be divided by the first dividing groove 22 having a closed-loop structure. In this manner, the third light emitting region 23 may emit light having different wavelengths than light emitted from the first light emitting region 21 and the second light emitting region 23.

In some exemplary embodiments, an insulation layer may be disposed on the first dividing groove 22 and the second dividing groove 24. The insulation layer may block unintended electrical connection between the first light emitting region 21 and the second light emitting region 23, and between the second light emitting region 23 and the third light emitting region 25. With the insulation layer, the light emitting diode can have an improved reliability for independent operation of the first light emitting region 21, the second light emitting region 23, and the third light emitting region 25.

FIG. 6B is a perspective view of the light emitting diode, illustrating the wavelength conversion layer 30 according to the illustrated exemplary embodiment. Referring to FIG. 6B, the wavelength conversion layer 30 may include a first wavelength conversion layer 31 corresponding to the first light emitting region 21, a second wavelength conversion layer 33 corresponding to the second light emitting region 23, and a third wavelength conversion layer 35 corresponding to third light emitting region 25. In addition, the wavelength conversion layer 30 may further include two barrier layers 32, 34 interposed between the first wavelength conversion layer 31 and the second wavelength conversion layer 33, and between the second wavelength conversion layer 33 and the third wavelength conversion layer 35, respectively. The barrier layer 32 may facilitate mixing of light having different wavelengths and emitted from the first wavelength conversion layer 31 and the second wavelength conversion layer 33, and may be disposed on the first dividing groove 22. In addition, the barrier layer 34 may facilitate mixing of light having different wavelengths and emitted from the second wavelength conversion layer 33 and the third wavelength conversion layer 35, and may be disposed on the second dividing groove 24.

The first wavelength conversion layer 31 may have the same or similar shape and area to the first light emitting region 21, the second wavelength conversion layer 33 may have the same or similar shape and area to the second light emitting region 23, and the third wavelength conversion layer 35 may have the same or similar shape and area to the third light emitting region 25. The first wavelength conversion layer 31 may include a first phosphor, the second wavelength conversion layer 33 may include a second phosphor, and the third wavelength conversion layer 35 may include a third phosphor. The first phosphor, the second phosphor, and the third phosphor may have the same or different compositions. For example, at least two of the first, second, and third phosphors may have substantially the same composition. In this manner, the light emitting diode can display various colors.

Referring to FIG. 6B, the lateral reflective layer 40 may surround the side surface of the light emitting structure 20. In addition, the lateral reflective layer 40 may surround not only the side surface of the light emitting structure 20, but also the side surface of the wavelength conversion layer 30. The light spreading layer 50 may cover the upper surface of the light emitting structure 20, and may extend in the horizontal direction to cover the upper surface of the lateral reflective layer 40.

Although FIGS. 6A and 6B show that the light emitting structure 20 includes three light emitting regions each having substantially a rectangular shape, however, the inventive concepts are not limited thereto. For example, the light emitting structure 20 in some exemplary embodiments may include three or more light emitting regions each having a shape selected from among a circular shape, a rectangular shape, a triangular shape, and a combination thereof. In addition, the wavelength conversion layer 30 may include various regions corresponding to the number of light emitting regions.

As shown in FIGS. 6A and 6B, when the light emitting diode includes three or more light emitting regions, the light emitting diode may include a light emitting structure including a first conductivity type semiconductor layer, an active layer, and a second conductivity type semiconductor layer, and n−1 dividing grooves dividing the light emitting structure into first to $n^{th}$ light emitting regions, in which an $m^{th}$ light emitting region surrounds an m−$1^{th}$ light emitting region, each of n and m is a natural number greater than or equal to 2, and m may be less than n. In addition, the light emitting diode may further include an insulation layer disposed on the n−1 dividing grooves and a wavelength conversion layer covering the first to $n^{th}$ light emitting regions. The wavelength conversion layer may include first to $n^{th}$ wavelength conversion layers corresponding to the first to $n^{th}$ light emitting regions, respectively. The first to $n^{th}$ wavelength conversion layer may include different phosphors, respectively. In addition, the wavelength conversion layer may further include n−1 barrier layers interposed between the first to $n^{th}$ wavelength conversion layers, respectively.

For example, the light emitting diode of FIGS. 6A and 6B has then value of 3 and the m value of 2 and 3. However, the inventive concepts are not limited thereto, and the values of n and m may be changed in various ways according to the number of light emitting regions.

The light emitting diode according to the illustrated exemplary embodiment can be modularized through a monofocal lens, as in the light emitting diode shown in FIGS. 1A to 2D.

Figure 7A:
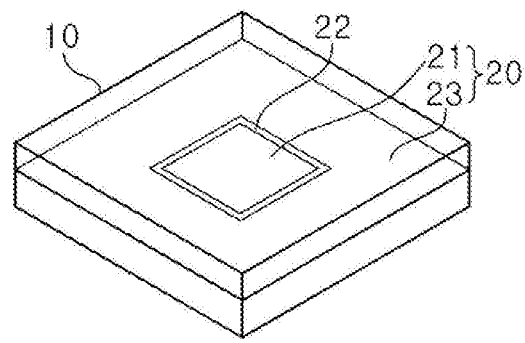
FIG. 7A and FIG. 7B are views of a light emitting diode according to still another exemplary embodiment.
Figure 7B:
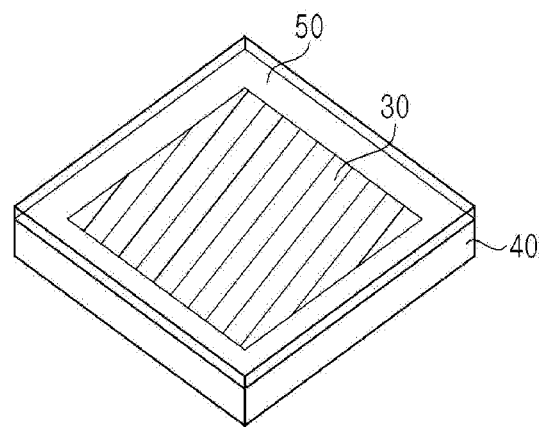

FIGS. 7A and 7B are views of a light emitting diode according to yet another exemplary embodiment. Most components of the light emitting diode according to the illustrated exemplary embodiment are similar to those of the light emitting diode shown in FIGS. 1A to 2D, excluding the wavelength conversion layer. As such, the following description will be focused on different features, and repeated descriptions of substantially the same components will be omitted.

FIG. 7A is a perspective view of the light emitting structure 20, illustrating the light emitting regions according to the illustrated exemplary embodiment. Referring to FIG. 7A, the light emitting structure 20 may include a first light emitting region 21 and a second light emitting region 23 defined by a dividing groove 22. The first light emitting region 21 and the second light emitting region 23 may be independently operated.

FIG. 7B is a perspective view of the light emitting diode, illustrating the wavelength conversion layer 30 according to the illustrated exemplary embodiment. The wavelength conversion layer 30 according to the illustrated exemplary is not divided into a plurality of regions, unlike the wavelength conversion layer 30 shown in FIGS. 1A to 2D. More particularly, although the wavelength conversion layer 30 covers the first light emitting region 21 and the second light emitting region 23, the wavelength conversion layer 30 is not divided to correspond to the first light emitting region 21 and the second light emitting region 23.

The light emitting diode according to the illustrated exemplary embodiment may adjust the beam angle of light emitted from the light emitting diode through application of the wavelength conversion layer 30 having the same composition to the first light emitting region 21 and the second light emitting region 23. As described above, since the first light emitting region 21 and the second light emitting region 23 may be independently operated, increase in output from the first light emitting region 21 disposed at the center of the light emitting diode can decrease the beam angle of the light emitting diode, and increase in output from the second light emitting region 23 disposed along the outer periphery of the light emitting diode can increase the beam angle of the light emitting diode.

The light emitting diode according to the illustrated exemplary embodiment can be modularized through a monofocal lens, as in the light emitting diode shown in FIGS. 1A to 2D.

Figure 8:
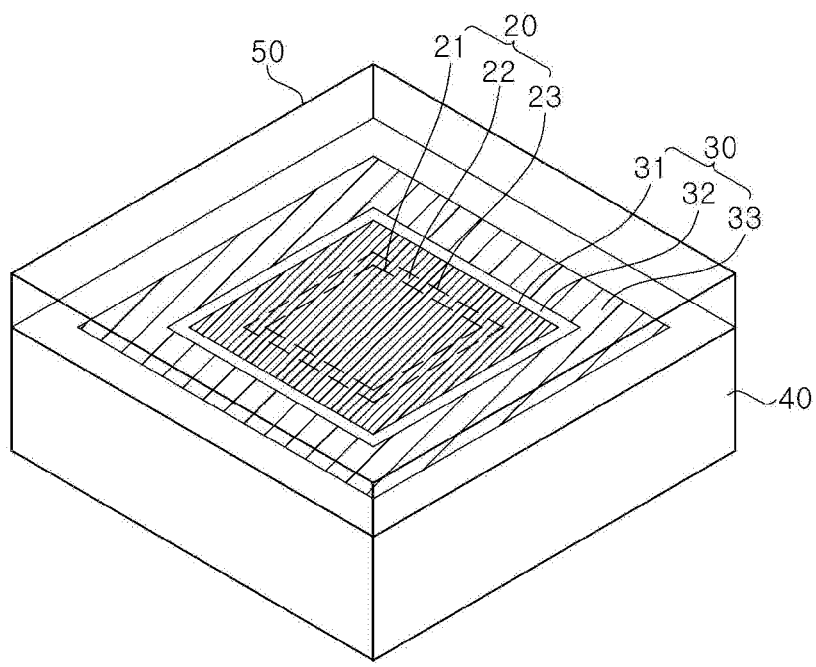
FIG. 8 is a view of a light emitting diode according to yet another exemplary embodiment.

FIG. 8 is a view of a light emitting diode according to yet another exemplary embodiment. Most components of the light emitting diode according to the illustrated exemplary embodiment are similar to those of the light emitting diode shown in FIGS. 1A to 2D, excluding the wavelength conversion layer. As such, the following description will be focused on different features, and repeated descriptions of substantially the same components will be omitted.

Referring to FIG. 8, the wavelength conversion layer 30 according to the illustrated exemplary embodiment includes a first wavelength conversion layer 31 and a second wavelength conversion layer 33. In addition, a barrier layer 32 may be interposed between the first wavelength conversion layer 31 and the second wavelength conversion layer 33. According to the illustrated exemplary embodiment, the first wavelength conversion layer 31 may be disposed on the first light emitting region 21 and may partially cover a dividing groove 22 and a second light emitting region 23. More particularly, the first wavelength conversion layer 31 may be formed to have a larger planar area than the first light emitting region 21, and may be extended to some region of the second light emitting region 23. The second wavelength conversion layer 33 may have a smaller planar area than that shown in FIGS. 1A and 1B, assuming that all of the light emitting regions have the same area.

As described above, the first light emitting region 21 and the second light emitting region 23 may be independently operated. In order to narrow the beam angle of light, power may be applied only to the first light emitting region 21 but not to the second light emitting region. In this case, the first wavelength conversion layer 31 may be formed to have a larger planar area than the first light emitting region 21, and a portion of the first wavelength conversion layer 31 disposed on the dividing groove 22 and the second light emitting region 23 may convert a wavelength of light emitted through the side surface of the first light emitting region 21. For example, in a structure realizing warm white light through the first light emitting region 21 and the first wavelength conversion layer 31, the first wavelength conversion layer 31 may be formed to have a relatively large area, thereby improving the reliability of the warm white light realized through the first light emitting region 21 and the first wavelength conversion layer 31.

The light emitting diode according to the illustrated exemplary embodiment can be modularized through a monofocal lens, as in the light emitting diode shown in FIGS. 1A to 2D.

Figure 9A:
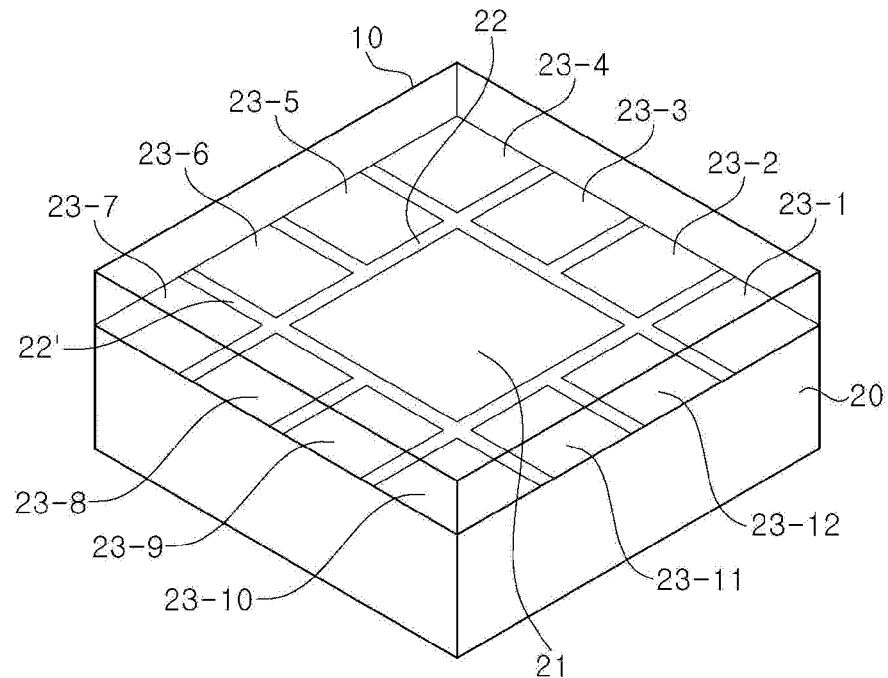
FIG. 9A and FIG. 9B are views of a light emitting diode according to yet another exemplary embodiment.
Figure 9B:
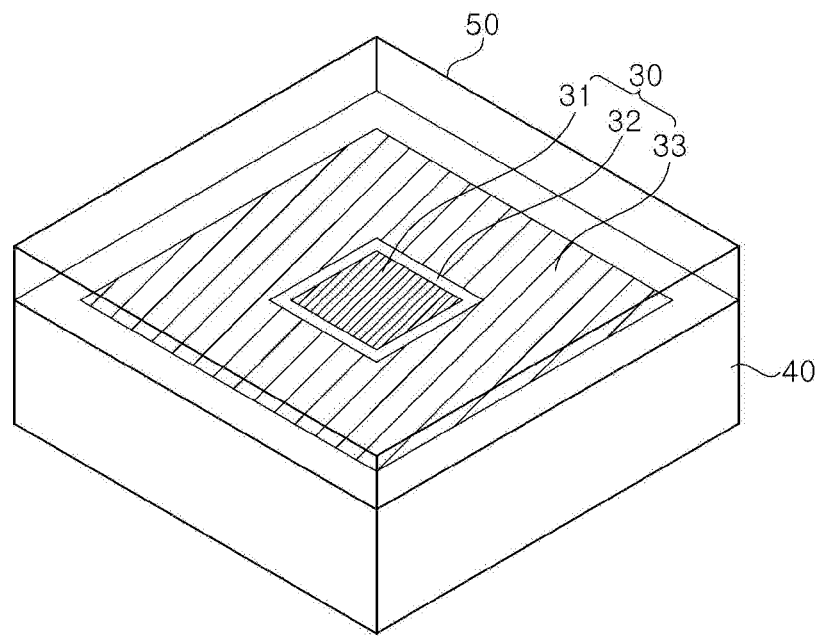

FIGS. 9A and 9B are views of a light emitting diode according to yet another exemplary embodiment. Most components of the light emitting diode according to the illustrated exemplary embodiment are similar to those of the light emitting diode shown in FIGS. 1A to 2D, excluding the second light emitting region. As such, the following description will be focused on different features, and repeated descriptions of substantially the same components will be omitted.

FIG. 9A is a perspective view of the light emitting structure 20, illustrating the light emitting regions according to the illustrated exemplary embodiment. Referring to FIG. 9A, the light emitting structure 20 may include a first light emitting region 21 and a second light emitting region 23 defined by a dividing groove 22. As described above, the first light emitting region 21 and the second light emitting region 23 may be independently operated. According to the illustrated exemplary embodiment, the second light emitting region 23 may include a plurality of light emitting cells 23-1 to 23-12 defined by dividing grooves 22'. The light emitting cells 23-1 to 23-12 may have the same area or different areas. Referring to FIG. 9A, the light emitting cells 23-1 to 23-12 may surround the first light emitting region 21.

FIG. 9B is a perspective view of the light emitting diode, illustrating the wavelength conversion layer 30 according to the illustrated exemplary embodiment. Referring to FIG. 9B, the wavelength conversion layer 30 may cover the light emitting structure 20. The wavelength conversion layer 30 may include a first wavelength conversion layer 31 corresponding to the first light emitting region 21, and a second wavelength conversion layer 33 corresponding to the second light emitting region 23. In addition, the wavelength conversion layer 30 may further include a barrier layer 32 to facilitate spreading of light having different wavelengths. The first wavelength conversion layer 31 may include a first phosphor, and the second wavelength conversion layer 33 may include a second phosphor. The first phosphor and the second phosphor may include different phosphor compositions. Although FIG. 9B shows that the second wavelength conversion layer 33 has a single continuous structure covering the plurality of light emitting cells 23-1 to 23-12 of the second light emitting region 23, however, the inventive concepts are not limited thereto. For example, in some exemplary embodiments, the second wavelength conversion layer 33 may include a plurality of disconnected structures to correspond to the plurality of light emitting cells 23-1 to 23-12, respectively.

According to the illustrated exemplary embodiment, the plurality of light emitting cells 23-1 to 23-12 of the second light emitting region 23 may be independently operated. That is, the plurality of light emitting cells 23-1 to 23-12 may be independently operated through on/off control.

For example, each of the light emitting regions 23-1 to 23-12 of the second light emitting region 23 may be independently operated through on/off control. As such, a luminous area of the second light emitting region 23 may be controlled. More particularly, the luminous area of the second light emitting region 23 may be increased or decreased through control of the number of light emitting cells to be turned on. By increasing or decreasing the luminous area of the second light emitting region 23 while operating the first light emitting region 21 to be turned on, it is possible to change output of the light emitting diode while adjusting the beam angle of the light emitting diode.

Alternatively, considering the wavelength conversion layer of FIG. 9B, the color temperature of the light emitting diode may be controlled by increasing or decreasing the luminous area of the second light emitting region 23 while operating the first light emitting region 21 to be turned on.

Figure 10:
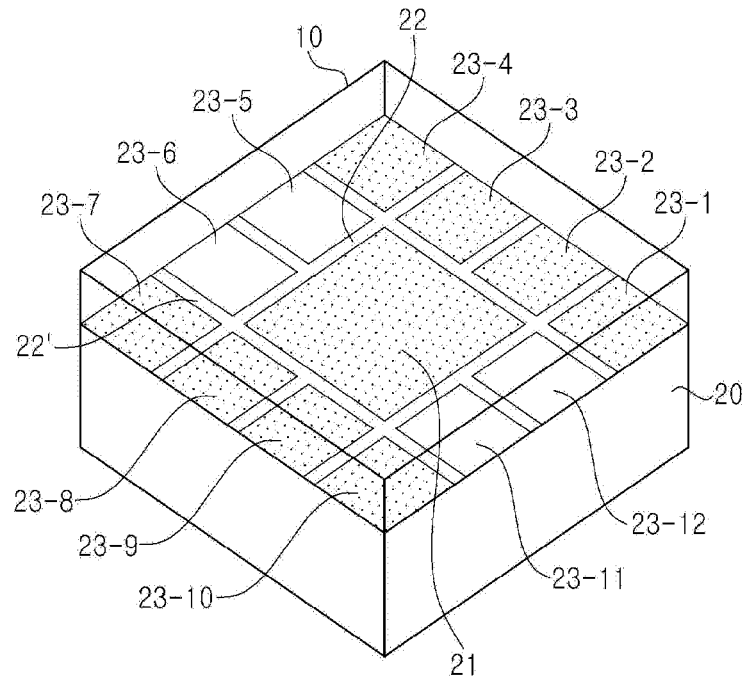
FIG. 10 is a view exemplarily illustrating an operation of the light emitting diode of FIG. 9A.

As another example, the light emitting cells 23-1 to 23-12 symmetrical with respect to the first light emitting region 21 may be simultaneously operated through on/off control. FIG. 10 exemplarily shows symmetrical on/off control of the light emitting cells. Referring to FIG. 10, first, the first light emitting region 21 is controlled to be independently turned on. The light emitting cells 23-1 to 23-4 and the light emitting cells 23-7 to 23-7 symmetrical with respect to the first light emitting region 21, for example, may be controlled to be simultaneously turned on. In this case, the light emitting cells 23-5, 23-6 and the light emitting cells 23-11, 23-12 symmetrical with respect to the first light emitting region 21 may be controlled to be simultaneously turned off. In this manner, as the light emitting cells 23-1 to 23-12 of the second light emitting region 23 are controlled to be turned on/off symmetrically with respect to the first light emitting region 21, light generated from the first light emitting region 21 and light generated from the second light emitting region 23 may have a collinear optical axis, thereby allowing the use of a monofocal lens upon modularization of the light emitting diode according to the illustrated exemplary embodiment.

FIG. 10 exemplarily shows one example of symmetrical on/off control of the light emitting cells 23-1 to 23-12 of the second light emitting region 23, however, the inventive concepts are not limited thereto. In another exemplary embodiment, the light emitting cells 23-1, 23-7 symmetrical with respect to the first light emitting region 21 may be simultaneously operated through on/off control. Alternatively, the light emitting cells 23-2, 23-3 and the light emitting cells 23-8, 23-9 symmetrical with respect to the first light emitting region 21 may be simultaneously operated through on/off control. As such, upon on/off control of the plurality of light emitting cells 23-1 to 23-3, any combination allowing the light emitting cells to be turned on/off symmetrically with respect to the first light emitting region 21 may be used.

Although FIG. 9 and FIG. 10 show that the second light emitting region 23 includes twelve light emitting cells 23-1 to 23-12, the inventive concepts are not limited to a particular number of the light emitting cells in the second light emitting region 23. For example, in some exemplary embodiments, the second light emitting region 23 may include any number of light emitting cells.

In addition, at least one of the first light emitting region 21 and the second light emitting region 23 may include a plurality of light emitting cells that can be independently controlled. In some exemplary embodiments, the first light emitting region 21 may also include a plurality of light emitting cells. For example, the first light emitting region 21 may include four light emitting cells. Alternatively, the first light emitting region 21 may include the same number of light emitting cells as in the second light emitting region 23. The light emitting cells of the first light emitting region 21 may have the same or different areas, and may be independently operated. Accordingly, the luminous area of the first light emitting region 21 may be controlled by independently controlling on/off of the light emitting cells included in the first light emitting region 21.

The light emitting diode according to the illustrated exemplary embodiment can be modularized through a monofocal lens, as in the light emitting diode shown in FIGS. 1A to 2D.

Figure 11A:
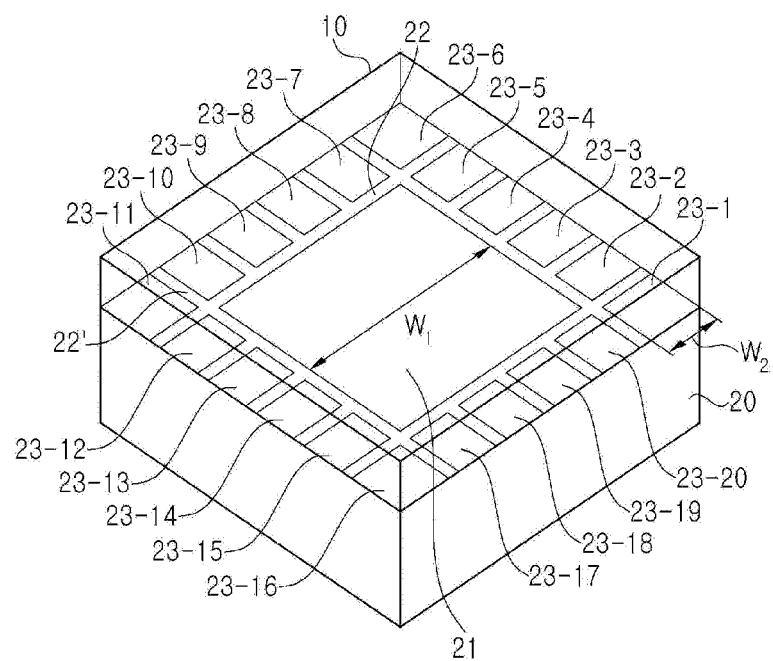
FIG. 11A and FIG. 11B are views of a light emitting diode according to yet another exemplary embodiment.
Figure 11B:
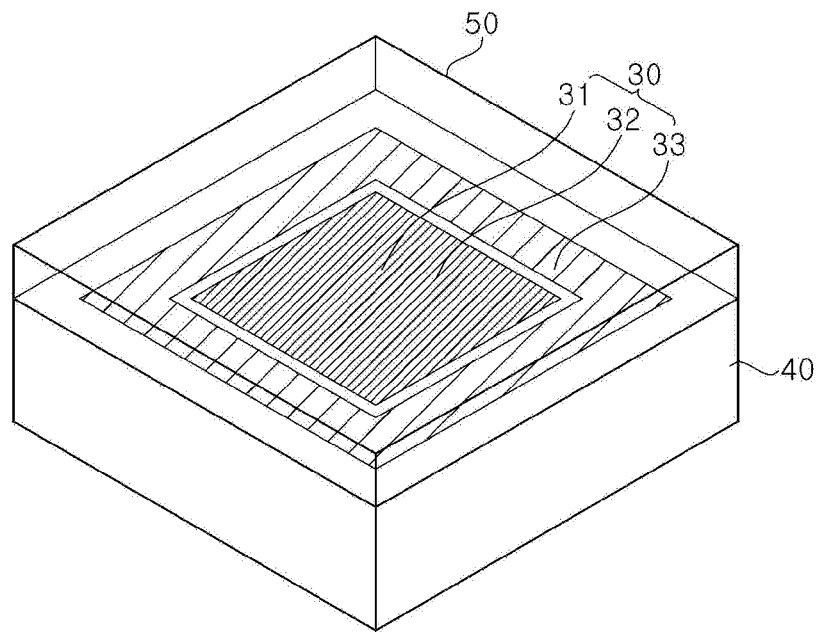

FIGS. 11A and 11B are views of a light emitting diode according to yet another exemplary embodiment. Most components of the light emitting diode according to the illustrated exemplary embodiment are similar to those of the light emitting diode shown in FIGS. 9A and 9B, excluding an area ratio of the first light emitting region 21 to the second light emitting region 23 and the number of light emitting cells 23-1 to 23-20 in the second light emitting region 23. As such, the following description will be focused on different features, and repeated descriptions of substantially the same components will be omitted.

FIG. 11A is a perspective view of the light emitting structure 20, illustrating the shapes of the light emitting regions according to the illustrated exemplary embodiment. FIG. 11B is a perspective view of the light emitting diode, illustrating the wavelength conversion layer 30 according to the illustrated exemplary embodiment.

Referring to FIG. 11A, the light emitting structure 20 includes a first light emitting region 21 and a second light emitting region 23 defined by a dividing groove 22. The second light emitting region 23 may surround the first light emitting region 21, and may include a plurality of light emitting cells 23-1 to 23-20 defined by dividing grooves 22'. According to the illustrated exemplary embodiment, the first light emitting region 21 has a larger planar area than the second light emitting region 23. More particularly, a width $W_1$ of the first light emitting region may be greater than a width $W_2$ of the individual light emitting cells of the second light emitting region 23. For example, the width $W_1$ may be at least three times greater than the width $W_2$.

Cool white light having a color temperature of 4,500 K to 6,500 K may be realized by the first light emitting region 21 and the first wavelength conversion layer 31 covering the first light emitting region 21, and warm white light having a color temperature of 2,300 K to 3,500 K may be realized by the second light emitting region 23 and the second wavelength conversion layer 33 covering the second light emitting region 23. In this case, the first light emitting region 21 may be formed to have a larger planar area than the second light emitting region 23 to realize white light emitted from the light emitting diode to be close to the cool white light. Such a light emitting diode may be suitably used for a camera flash lamp and the like.

The light emitting diode according to the illustrated exemplary embodiment also allows not only independent operation of the first light emitting region 21 and the second light emitting region 23, but also independent operation of the light emitting cells 23-1 to 23-20 in the second light emitting region 23. Accordingly, the light emitting diode according to the illustrated exemplary embodiment can control the luminous area of the second light emitting region 23 and the color temperature of warm white light emitted therefrom.

Alternatively, depending upon the type of application for the light emitting diode, the second light emitting region 23 may be formed to have a larger planar area than the first light emitting region 21. Alternatively, the first light emitting region 21 and the second light emitting region 23 may have the same planar area.

The light emitting diode according to the illustrated exemplary embodiment can be modularized through a monofocal lens, as in the light emitting diode shown in FIGS. 1A to 2D.

Figure 12A:
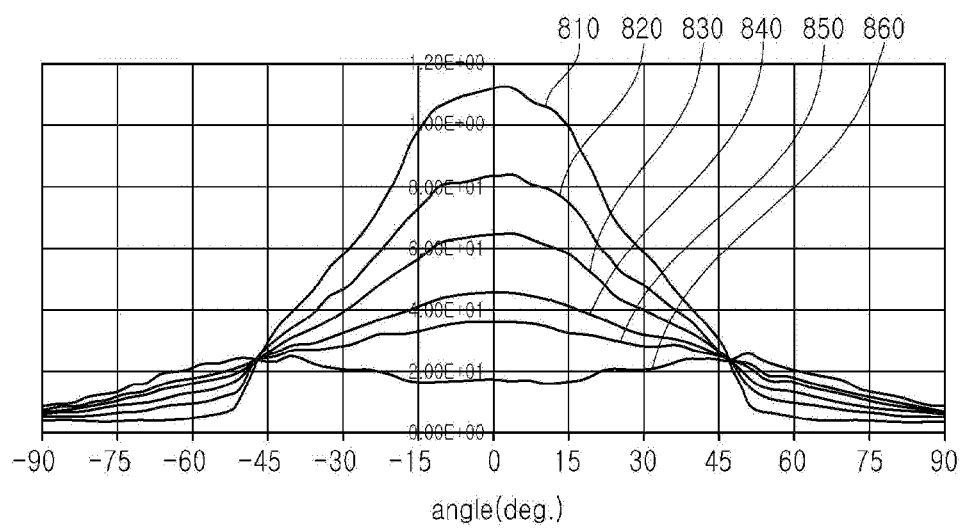
FIG. 12A and FIG. 12B are graphs depicting beam angle distribution of a light emitting diode according to an exemplary embodiment.
Figure 12B:
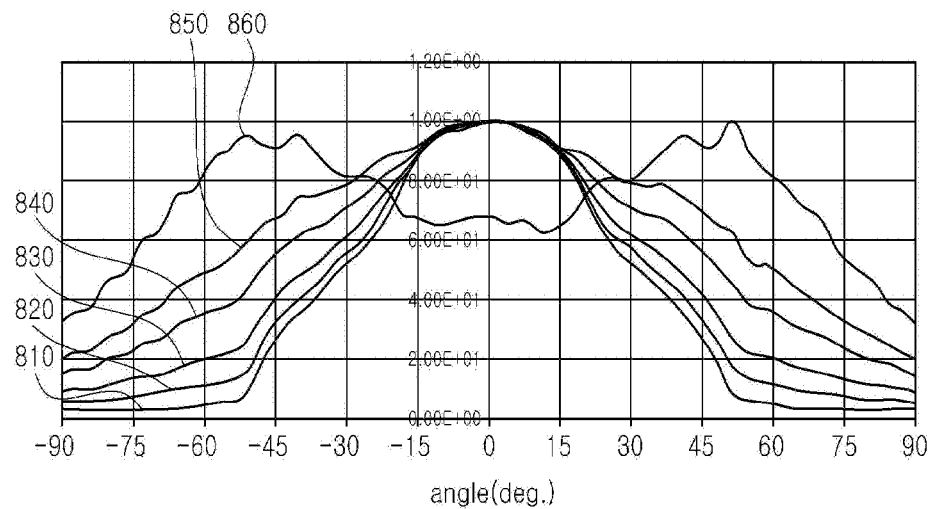

FIGS. 12A and 12B are graphs depicting variation in beam angle of the light emitting diode depending upon electric power applied to the light emitting diode.

As described above, the light emitting diode includes the first light emitting region 21 and the second light emitting region 23, which can be independently operated. A ratio of power applied to the first light emitting region 21 and the second light emitting region 23 may be controlled, for example, as shown in Table 1.

TABLE 1

| Experiment | Power ratio | | | | | |
| --- | --- | --- | --- | --- | --- | --- |
| | Experiment 1 | Experiment 2 | Experiment 3 | Experiment 4 | Experiment 5 | Experiment 6 |
| Light emitting region 1 | 1 | 0.7 | 0.5 | 0.3 | 0.2 | 0 |
| Light emitting region 2 | 0 | 0.3 | 0.5 | 0.7 | 0.8 | 1 |

FIG. 12A and FIG. 12B show beam angle distribution of the light emitting diode in accordance with data shown in Table 1.

In FIG. 12A, the horizontal axis indicates the beam angle of the light emitting diode and the transverse axis indicates the intensity of light. In FIG. 12B, the horizontal axis indicates the beam angle of the light emitting diode and the transverse axis indicates the intensity of standardized light. That is, FIG. 12B is a graph in which a portion exhibiting the highest intensity of light is converted into 1 in each experiment to more clearly show a difference between beam angles in Experiments 1 to 6.

Referring to FIG. 12A and FIG. 12B, each of the curves 810 to 860 shows a result obtained by application of data of Experiments 1 to 6. Referring to Curve 810 with respect to Experiment 1, it can be seen that the light emitting diode has a narrow beam angle when the first light emitting region 21 disposed at the center of the light emitting diode has a high power ratio. On the other hand, referring to Curve 860 with respect to Experiment 6, it can be seen that the light emitting diode has a broad beam angle when the second light emitting region 23 surrounding the first light emitting region 21 has a high power ratio.

Accordingly, the light emitting diode according to the exemplary embodiments can change the beam angle of light emitted therefrom by controlling the ratio of power applied to the first light emitting region 21 and the second light emitting region 23.

Figure 13:
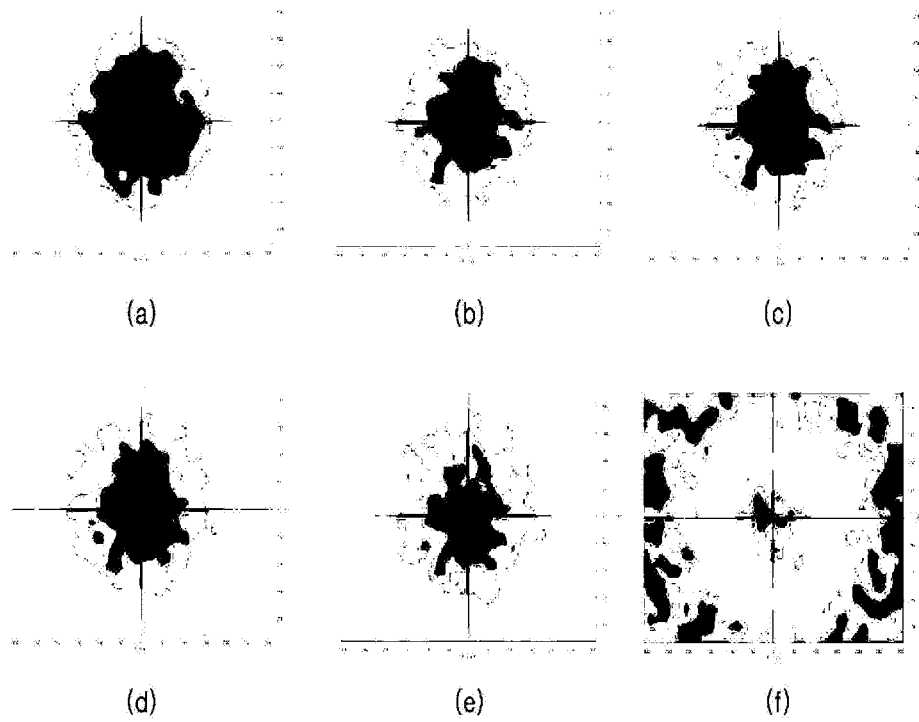
FIG. 13 shows experimental examples of light distribution variation depending upon the ratio of power applied to the light emitting diode according to an exemplary embodiment.

FIG. 13 shows experimental examples of a light distribution variation depending upon control of the ratio of power applied to the light emitting diode. More specifically, graph (a) in FIG. 13 shows light distribution of the light emitting diode to which data of Experiments 1 to 6 shown in Table 1 are applied.

In the graphs (a) to (f), a darker color indicates higher intensity of light. Referring to the graph (a) of FIG. 13, it can be seen that a dark color is exhibited in a relatively narrow region at the center of the light emitting diode when the first light emitting region 21 disposed at the center of the light emitting diode has a higher power ratio. On the other hand, referring to the graph (f) of FIG. 13, it can be seen that a dark color is exhibited in a relatively wide region when the second light emitting region 23 surrounding the first light emitting region 21 has a high power ratio. This result can be considered identical to the result obtained through the graphs of FIG. 12A and FIG. 12B. More particularly, when a higher power ratio is applied to the first light emitting region 21, the beam angle of the light emitting diode is narrowed, and when a higher power ratio is applied to the second light emitting region 23, the beam angle of the light emitting diode is increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art

What is claimed is:

1. A light emitting diode comprising:
   a first light emitting region; and
   a second light emitting region spaced apart from and surrounding the first light emitting region,
   wherein:
   the first light emitting region and the second light emitting region are configured to be independently operated; and
   a center of the first light emitting region overlaps a center of the second light emitting region.

2. The light emitting diode of claim 1, further comprising a wavelength conversion layer covering the first light emitting region and the second light emitting region.

3. The light emitting diode of claim 2, wherein the first light emitting region and the second light emitting region are coupled to each other by a single substrate, the substrate being disposed between the first and second light emitting regions and the wavelength conversion layer.

4. The light emitting diode of claim 2, wherein the wavelength conversion layer comprises phosphors having substantially the same composition at portions corresponding to the first light emitting region and the second light emitting region.

5. The light emitting diode of claim 1, wherein the second light emitting region comprises a plurality of light emitting cells surrounding the first light emitting region, the plurality of light emitting cells being configured to be independently operated through on/off control.

6. The light emitting diode of claim 5, wherein at least two light emitting cells that are symmetrically disposed with respect to the first light emitting region are configured to be simultaneously operated through on/off control.

7. A light emitting diode comprising:
a first light emitting region; and
a second light emitting region spaced apart from and surrounding the first light emitting region,
wherein:
each of the first light emitting region and the second light emitting region comprises a first conductivity type semiconductor layer, an active layer, and a second conductivity type semiconductor layer; and
the first and second light emitting regions are configured to emit light in the same wavelength band and are configured to be independently operated.

8. A light emitting diode comprising:
a first light emitting region; and
a second light emitting region spaced apart from and surrounding the first light emitting region,
wherein:
each of the first light emitting region and the second light emitting region comprises a first conductivity type semiconductor layer, an active layer, and a second conductivity type semiconductor layer; and
the first and second light emitting regions are configured to emit light having a wavelength band different from each other and are configured to be independently operated.

9. A light emitting diode comprising:
a first light emitting region;
a second light emitting region spaced apart from and surrounding the first light emitting region; and
a wavelength conversion layer covering the first light emitting region and the second light emitting region and comprising:
a first wavelength conversion layer disposed on the first light emitting region and including a first phosphor; and
a second wavelength conversion layer disposed on the second light emitting region to surround the first wavelength conversion layer and including a second phosphor,
wherein the first light emitting region and the second light emitting region are configured to be independently operated.

10. The light emitting diode of claim 9, wherein the first wavelength conversion layer covers the entire first light emitting region and a portion of the second light emitting region.

11. The light emitting diode of claim 9, wherein:
the first light emitting region and the first phosphor are configured to emit light having a color temperature in a range of 2,300 K to 3,500 K; and
the second light emitting region and the second phosphor are configured to emit light having a color temperature in a range of 4,500 K to 6,500 K.

12. A light emitting diode comprising:
a first light emitting region; and
a second light emitting region spaced apart from and surrounding the first light emitting region,
wherein:
the first light emitting region and the second light emitting region are configured to be independently operated; and
the first light emitting region has a larger planar area than the second light emitting region.

13. A light emitting diode comprising:
a first light emitting region; and
a second light emitting region spaced apart from and surrounding the first light emitting region,
wherein:
the first light emitting region and the second light emitting region are configured to be independently operated; and
at least one of the first and second light emitting regions comprises a plurality of light emitting cells configured to be independently operated through on/off control.

14. A light emitting module comprising:
a light emitting diode comprising a first light emitting region and a second light emitting region spaced apart from and surrounding the first light emitting region; and
a monofocal lens disposed on the light emitting diode,
wherein the first light emitting region and the second light emitting region are configured to be independently operated.

15. The light emitting module of claim 14, wherein the light emitting diode further comprises a wavelength conversion layer covering the first light emitting region and the second light emitting region.

16. The light emitting module of claim 15, wherein the wavelength conversion layer comprises:
a first wavelength conversion layer corresponding to the first light emitting region and including a first phosphor; and
a second wavelength conversion layer corresponding to the second light emitting region and including a second phosphor.

17. The light emitting module of claim 14, wherein:
the second light emitting region comprises a plurality of light emitting cells surrounding the first light emitting region; and
the plurality of light emitting cells are configured to be independently operated through on/off control to adjust a luminous area of the second light emitting region.

18. The light emitting module of claim 17, wherein at least two light emitting cells that are disposed symmetrically with respect to the first light emitting region are configured to be simultaneously operated through on/off control.

19. The light emitting module of claim 14, further comprising:
a substrate including an electrode pattern; and
a housing disposed on the substrate and including a cavity, wherein the light emitting diode is mounted inside the cavity.

* * * * *